(12) United States Patent
Apel et al.

(10) Patent No.: US 7,345,537 B2
(45) Date of Patent: Mar. 18, 2008

(54) LINEAR POWER AMPLIFIER WITH MULTIPLE OUTPUT POWER LEVELS

(75) Inventors: Thomas R. Apel, Portland, OR (US); Tarun Juneja, Beaverton, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/666,552

(22) Filed: Sep. 19, 2003

(65) Prior Publication Data

US 2004/0108901 A1 Jun. 10, 2004

Related U.S. Application Data

(60) Provisional application No. 60/416,039, filed on Oct. 4, 2002, provisional application No. 60/412,342, filed on Sep. 20, 2002.

(51) Int. Cl.
*H03G 9/00* (2006.01)
*H03G 5/16* (2006.01)

(52) U.S. Cl. ............... 330/134; 330/124 R; 330/124 D; 330/133

(58) Field of Classification Search ............ 330/124 R, 330/124 D, 295, 51, 130, 133, 134, 202, 330/296
See application file for complete search history.

(56) References Cited

U.S. PATENT DOCUMENTS

| | | | |
|---|---|---|---|
| 5,162,756 A * | 11/1992 | Taniguchi et al. | 330/295 |
| 5,541,554 A | 7/1996 | Stengel et al. | |
| 5,629,648 A | 5/1997 | Pratt | |
| 5,880,633 A | 3/1999 | Leizerovich et al. | |
| 5,886,575 A | 3/1999 | Long | |
| 6,137,355 A | 10/2000 | Sevic et al. | |
| 6,262,629 B1 | 7/2001 | Stengel et al. | |
| 6,329,877 B1 | 12/2001 | Bowen et al. | |
| 6,359,514 B1 | 3/2002 | King et al. | |
| 6,374,092 B1 | 4/2002 | Leizerovich et al. | |
| 6,617,929 B2 * | 9/2003 | Kim et al. | 330/295 |
| 7,123,096 B2 | 10/2006 | Selin | |
| 7,227,418 B2 | 6/2007 | Makioka | |

(Continued)

OTHER PUBLICATIONS

Holt "Electronic Circuits" John Wiley & Sons 1978 p. 500.*

(Continued)

*Primary Examiner*—David Nelms
*Assistant Examiner*—David Y. Chung
(74) *Attorney, Agent, or Firm*—Bever Hoffman & Harms LLP

(57) ABSTRACT

A power amplifier stage has a first amplifier subsection and a second amplifier subsection coupled in a parallel configuration. The first amplifier subsection receives a signal to be amplified and the second amplifier subsection receives the signal to be amplified via a first delay line. The amplified output signal of the first amplifier subsection is passed through a second impedance inverter and is combined with the amplified output signal from the second amplifier subsection. In a low power mode, the first amplifier subsection operates as a linear amplifier and the second subsection is biased off. In a high power mode, both the first and second amplifier subsections operate as linear amplifiers. Selecting the impedances of the second delay element and the first amplifier to be equal is essential for high power mode operation and greatly improves the amplifier efficiency in the low power mode.

12 Claims, 7 Drawing Sheets

U.S. PATENT DOCUMENTS

| | | |
|---|---|---|
| 2001/0022534 A1* | 9/2001 | Otani .................... 330/302 |
| 2002/0093383 A1 | 7/2002 | Thompson |
| 2002/0132652 A1 | 9/2002 | Steel et al. |
| 2002/0135425 A1 | 9/2002 | Kim et al. |
| 2002/0190790 A1* | 12/2002 | Cheng et al. .................. 330/51 |

OTHER PUBLICATIONS

Sedra et al. (Sedra) Microelectronic Circuits Fifth edition p. 749.*

* cited by examiner

LINEAR POWER AMPLIFIER WITH MULTIPLE OUTPUT POWER LEVELS

RELATED APPLICATIONS

The present application claims priority provisional U.S. Patent Application Ser. No. 60/416,039 entitled "Linear Power Amplifier With Multiple Output Power Levels" by Thomas R. Apel, which was filed Oct. 4, 2002, and from provisional U.S. Patent Application No. 60/412,342 entitled "EFFICIENT POWER CONTROL BY PERIPHERY SWITCHING" filed Sep. 20, 2002 by Thomas R. Apel, both of which are incorporated herein by reference.

BACKGROUND

1. Field of the Invention

The present invention relates to radio frequency or microwave electronic power amplifiers, and more particularly to radio frequency or microwave electronic power amplifiers that may be controlled to produce two or more selectable output power levels for a particular input signal.

2. Related Art

Linear power amplifiers are often operated in class AB mode. Operation in class AB mode provides for reduced power supply current to the power amplifier as the power of the input signal is reduced. The power supply current can be reduced until a minimum quiescent current is reached. The direct current (DC) power to radio frequency (RF) power efficiency degrades as the power of the input signal is reduced. Some conventional linear power amplifiers provide an improvement in low power efficiency by stepping the quiescent current to a lower level for low power operation. However, the linearity of the power amplifier is degraded at very low quiescent current levels. This is described in more detail below in connection with FIG. 1.

FIG. 1 is a circuit diagram illustrating a conventional power amplifier 100, which includes amplifier stages 101-102 and associated bias circuits 111-112. Each of amplifier stages 101-102 includes a parallel-connected set of NPN bipolar transistors 103-104, respectively. Ballast resistors 105-106 are connected to the bases of transistor sets 103-104. In general, the bases of transistor sets 103-104 are configured to receive a radio frequency input signal (e.g., $RF_{IN}$). The emitters of transistor sets 103-104 are coupled to ground, and the collectors of transistors sets 103-104 are configured to provide an RF output signal (e.g., $RF_{OUT}$) to an output terminal of the associated amplifier stage.

When the input signal $RF_{IN}$ is controlled to be a high power signal (i.e., during high-power operation), a HI/LO control signal is activated to a first logic state. In response, bias voltage control circuits 111-112 provide relatively high bias voltages $V_{BIAS1}$-$V_{BIAS2}$. As a result, amplifier stages 101-102 operate in a linear manner in response to the $RF_{IN}$ signal. Conversely, when the input signal $RF_{IN}$ is controlled to be a low power signal (i.e., during low-power operation), the HI/LO control signal is deactivated to a second logic state. In response, bias control circuits 111-112 provide relatively low bias voltages $V_{BIAS1}$-$V_{BIAS2}$. Because the power amplifier transistors 103-104 in stages 101-102 are each biased uniformly, the current reduction represents a current density reduction in the constituent cells that comprise 103-104. Under these conditions, amplifier stages 101-102 consume less power, but the linearity of power amplifier 100 is degraded under these conditions.

Moreover, in both high power operation and low power operation, power amplifier 100 sees the same load impedance, $R_L$. However, the optimum load impedance for high power operation is not the same as the optimum load impedance for low power operation. Because the load impedance is typically optimized for high power operation, the power amplifier exhibits degraded power efficiency during following deficiencies during lower power operation. This is significant in handset applications, since talk-time is dependent on efficient power amplifier operation.

A conventional Doherty amplifier, known since the 1930s, provides another way to increase amplifier efficiency. In a typical Doherty amplifier, an input signal to be amplified is split and follows two paths. The power split is typically half power in each path. The paths are later joined and the amplified signal is output to an antenna for transmission. Each path includes a phase delay component. A linear amplifier operates in one path. This linear amplifier is commonly referred to as the carrier amplifier, since Doherty amplifiers were originally designed for amplitude modulated (AM) signals. The carrier amplifier is typically designed to drive a load that is twice the impedance of the peaking amplifier for maximum amplifier efficiency of the carrier amplifier. A non-linear (e.g., class B or C) amplifier operates in the second path. This amplifier is commonly referred to as the peaking amplifier. The carrier and peaking amplifier are typically comprised of equivalent peak power capability amplifiers. When the input signal power to the Doherty amplifier exceeds an input threshold, the peaking amplifier begins to operate. At low power levels (e.g., unmodulated AM carrier level), the carrier amplifier operates efficiently. As the input power level increases to the level where the peaking amplifier begins to contribute significantly to the output power, the overall high efficiency is maintained since the peaking amplifier is operating in a naturally more efficient mode. Peaking amplifier operation lowers the effective load driven by the carrier amplifier, and the overall efficiency is maintained at a relatively high level. However, the Doherty amplifier provides somewhat non-linear amplification, which is unacceptable for certain signal transmissions, such as CDMA.

It would therefore be desirable to have a power amplifier that does not require an extremely low quiescent current density during low power operation (i.e., when the input signal power is relatively low), because such low quiescent current density results in non-linear amplification. It would be desirable for such a power amplifier to exhibit linear amplification. It would further be desirable for such a power amplifier to have an optimized load impedance for both high power operation and low power operation. The optimized load impedance raises the power efficiency of the amplifier while maintaining linear amplification.

SUMMARY

Accordingly, the present invention provides a power amplifier stage that includes a first amplifier subsection coupled in parallel with a second amplifier subsection. The first amplifier subsection is coupled to receive an input signal, and in response, provides a first output signal. A first impedance inverter circuit introduces a first delay to the input signal, thereby creating a delayed input signal, which is provided to the second amplifier subsection. In response, the second amplifier subsection provides a first delayed output signal. A second impedance inverter circuit coupled to the first amplifier subsection introduces a second delay to the first output signal, thereby creating a second delayed output signal. The first and second delays are selected to be equivalent, such that the first and second delayed output signals are in phase, and can be readily combined to create an amplified output signal.

A bias control circuit provides a first bias voltage to the first amplifier subsection, and a second bias voltage to the second amplifier subsection. When the first bias voltage is activated, the first amplifier subsection is enabled to operate in a linear mode. Similarly, when the second bias voltage is activated, the second amplifier subsection is enabled to operate in a linear mode.

To operate the power amplifier stage in a high power mode, both the first and second bias voltages are activated, thereby enabling both the first and second amplifier subsections. To operate the power amplifier stage in a low power mode, the first bias voltage is activated and the second bias voltage is de-activated, thereby enabling the first amplifier subsection and disabling the second amplifier subsection. This reduces the overall quiescent current for the stage, but does not change the quiescent current for the first amplifier.

In accordance with one embodiment, the impedance of the second impedance inverter is selected to be equal to the optimum full power loading impedance of the first amplifier subsection. The equivalent parallel impedance of the first and second amplifier subsections is observed to be equal to the external load impedance coupled to receive the amplified output signal. As a result, the efficiency of the power amplifier stage can be optimized during both high power and low power operation.

The present invention will be more fully understood in view of the following description and drawings.

DETAILED DESCRIPTION

Figure 1:
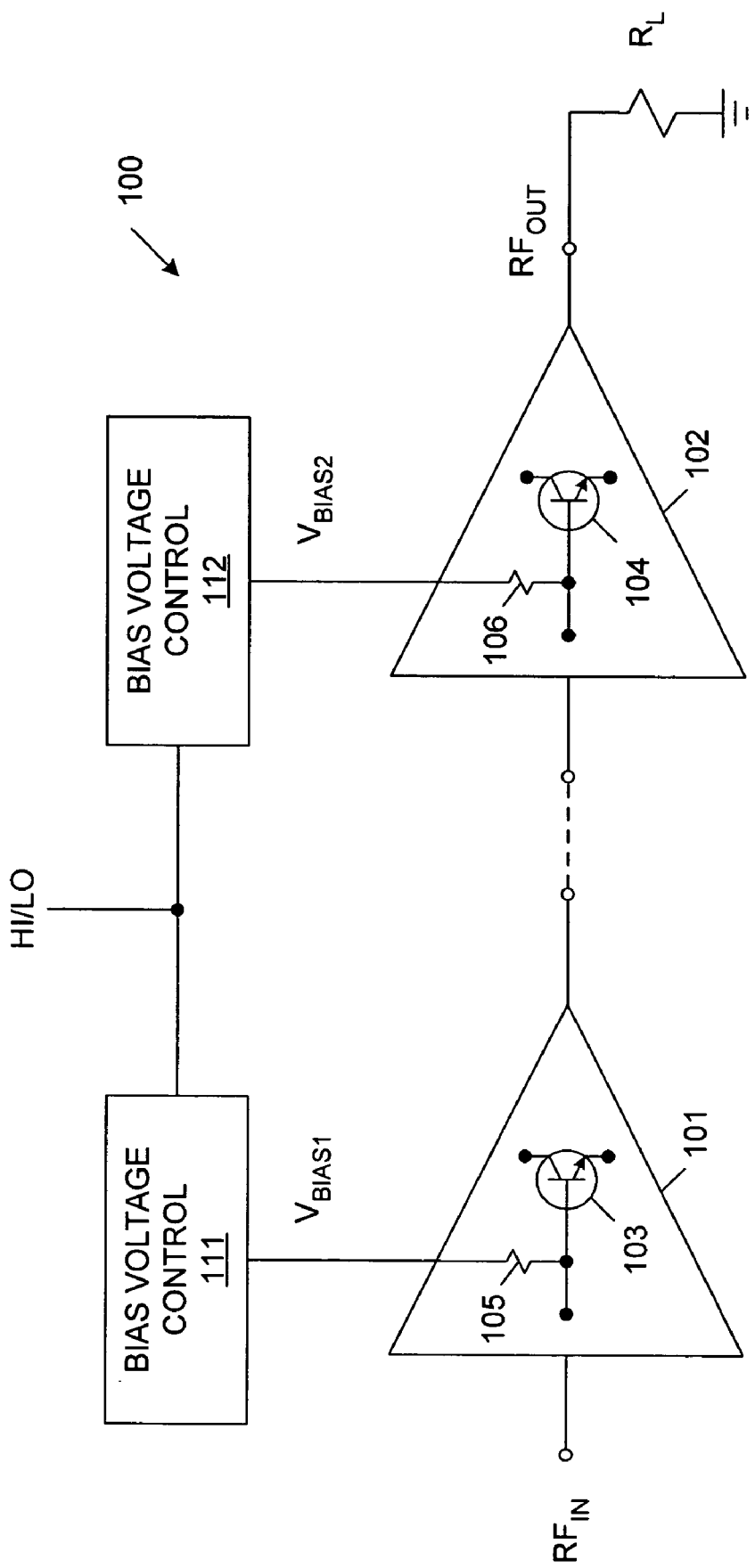
FIG. 1 is a circuit diagram of a conventional power amplifier circuit.

Skilled artisans will understand that certain well-known electronic circuit features (e.g., power supply lines) have been omitted so as to more clearly illustrate embodiments of the invention. Like-numbered elements in the drawings refer to the same or substantially similar elements among the various embodiments. For example, embodiments are generally described in terms of bipolar junction transistor (BJT) technology (e.g., multi-cell heterojunction bipolar junction transistors (HBTs)), but skilled artisans will understand that field effect transistor (FET) technology or even vacuum tube technology is easily adapted to the disclosed circuit topologies. For instance, an FET or vacuum triode may be substituted for a BJT.

Some embodiments are formed on a gallium arsenide (GaAs) substrate using conventional GaAs fabrication. Other semiconductor materials (e.g., silicon, indium phosphide) may be used in other embodiments.

Embodiments are described in terms of cellular radio transceiver handsets (i.e., "cellular telephones") but skilled artisans will understand that embodiments are not limited to the described embodiments.

Figure 2:
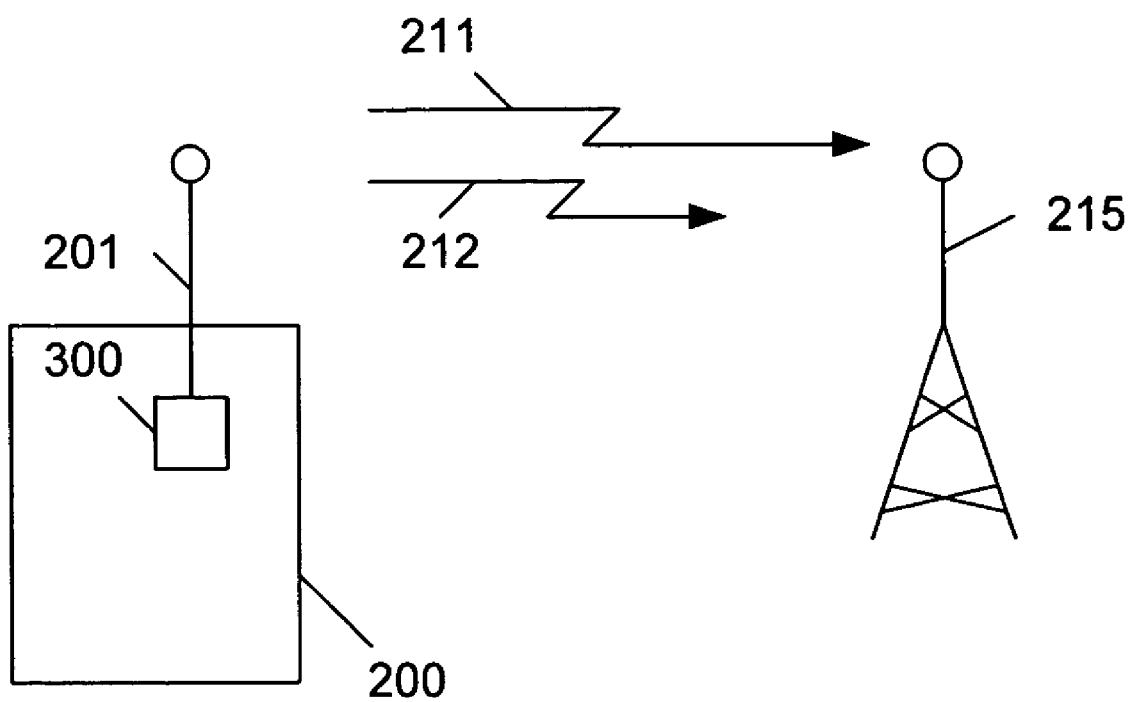
FIG. 2 is a block diagram of a cellular telephone handset and a receiving antenna in accordance with one embodiment of the present invention.

FIG. 2 is a block diagram of a cellular telephone handset 200 and a receiving antenna 215 in accordance with one embodiment of the present invention. Cellular telephone transceiver handset 200 includes final stage electronic power amplifier 300. Power amplifier 300 provides variable and selectable output power levels to antenna 201 such that an illustrative variable high power wireless signal 211 or an illustrative variable low power wireless signal 212 is transmitted to receiving antenna 215. Note that there is typically a duplexer or filter (not shown) between power amplifier circuit 300 and antenna 201. The two output power levels are illustrative. In other embodiments three or more selectable output power levels are provided. Antenna 215 can be coupled, for example, to a Mobile Telephone Switching Office (MTSO) (not shown).

Figure 3:
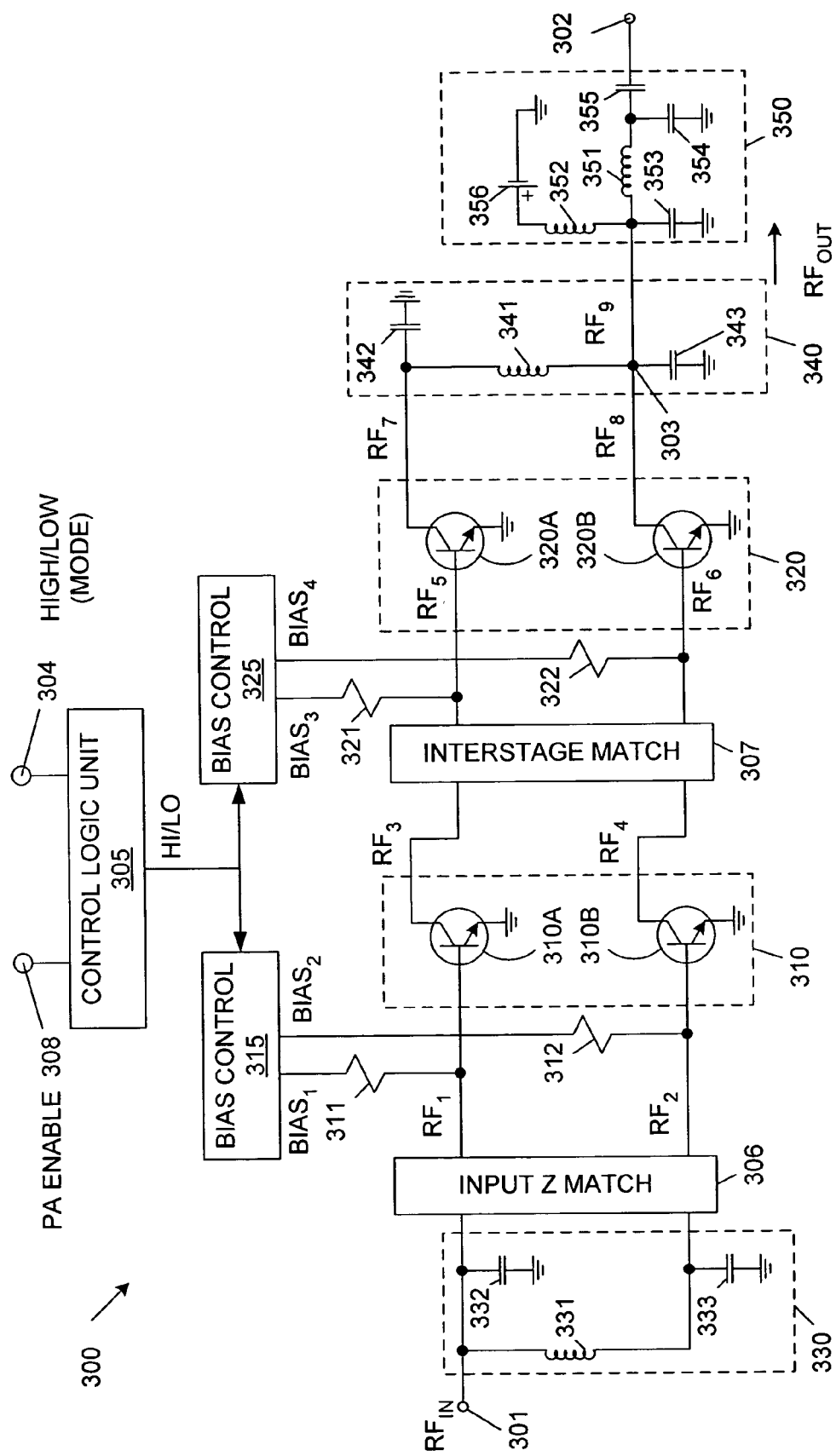
FIG. 3 is a block diagram of a linear power amplifier circuit having a low power mode and a high power mode, in accordance with one embodiment of the present invention.

FIG. 3 is a circuit diagram illustrating power amplifier circuit 300 in accordance with one embodiment of the present invention. Power amplifier circuit 300 includes input terminal 301, output terminal 302, intermediate output terminal 303, control logic unit 305, input impedance match circuit 306, inter-stage impedance match circuit 307, input stage amplifier 310, bias resistors 311-312, input stage bias control circuit 315, output stage amplifier 320, bias resistors 321-322, output stage bias control circuit 325, delay element 330, impedance inverting delay element 340 and output impedance match circuit 350. Input stage amplifier 310 includes amplifier subsections 310A and 310B. Output stage amplifier 320 includes amplifier subsections 320A and 320B. In the described embodiments, delay element 330 is an LC low pass impedance inverter circuit that includes inductor 331 and capacitors 332-333. Similarly, delay element 340 is an LC low pass impedance inverter circuit that includes inductor 341 and capacitors 342-343. In other embodiments, delay element 330 and impedance inverter 340 can be implemented by other circuits (e.g., a quarter wavelength transmission line). Output impedance match circuit 350 includes inductors 351-352, capacitors 353-355 and voltage source 356. The particular form of impedance match circuit 350 is not essential to the invention, because this impedance match circuit simply transforms the load at output terminal 302 to the loading level at intermediate output terminal 303. Without impedance match circuit 350, the essential aspects of the invention are unchanged.

As shown in the embodiment of FIG. 3, power amplifier circuit 300 has two amplifier stages 310 and 320. Both primary amplifier stage 310 and final amplifier stage 320 have multiple amplifier subsections. Primary amplifier stage 310 includes amplifier subsections 310A and 310B, and final amplifier stage 320 includes amplifier subsections 320A and 320B. Note that amplifier subsections 310A, 310B, 320A and 320B are illustrative. Three or more amplifier subsections may be used in each stage, as described below. Amplifier subsections 310A, 310B, 320A and 320B are illustratively shown as NPN bipolar junction transistors (BJTs). In other embodiments, different transistor types (e.g., field-effect transistors) can be used instead of BJTs. In the described embodiment, amplifier stages 310 and 320 each include multi-cell heterojunction bipolar transistors (HBTs) formed using conventional gallium arsenide fabrication methods.

Each of amplifier subsections 310A, 310B, 320A and 320B may be a single HBT cell, or may be multiple HBT cells coupled to provide a single output. The depicted number of amplifier stages is illustrative. In other embodiments, one, three, or more series-coupled amplifier stages are used.

As also shown in FIG. 3, amplifier subsections 310A and 320A are connected in cascade between input terminal 301 and intermediate output terminal 303. Similarly, amplifier subsection 310B and 320B are connected in cascade between input terminal 301 and intermediate output terminal 303. The cascaded amplifier subsections 310A and 320A are coupled in parallel with the cascaded amplifier subsections 310B and 320B.

As shown in FIG. 3, a radio frequency input signal $RF_{IN}$ is provided to input terminal 301 by a signal source (not shown). In some instances, $RF_{IN}$ is a signal processed to carry information in accordance with conventional Time Division Multiple Access (TDMA), Code Division Multiple Access (CDMA), or Enhanced Data GSM (Global System for Mobile Communication) Environment (EDGE) processing. These signal processing methods are illustrative of modulation modes used to encode or distribute information in a signal, and for which linear amplifier operation is required. Input signal $RF_{IN}$ is illustratively in the 800 megaHertz (MHz) or 1.9 GHz cellular telephony frequency band.

The $RF_{IN}$ signal is routed from input terminal 301 to the base of amplifier subsection 310A through input impedance match circuit 306. The $RF_{IN}$ signal is routed from input terminal 301 to the base of amplifier subsection 310B through delay circuit 330 and input impedance match circuit 306. As a result, amplifier subsection 310B receives a delayed version of the $RF_{IN}$ signal (compared to the version of the $RF_{IN}$ signal received by amplifier subsection 310A). The RF signals received at the bases of amplifiers 310A and 310B are labeled as signals $RF_1$ and $RF_2$, respectively. Thus, the $RF_2$ signal is a delayed version of the $RF_1$ signal.

When enabled, amplifier subsections 310A and 310B provide corresponding output signals $RF_3$ and $RF_4$ in response to the corresponding input signals $RF_1$ and $RF_2$. These amplified output signals $RF_3$ and $RF_4$ are routed through inter-stage impedance match circuit 307 to the bases of amplifier subsections 320A and 320B, respectively. The RF signals received at the bases of amplifier subsections 320A and 320B are labeled as signals $RF_5$ and $RF_6$, respectively. Inter-stage impedance match circuit 307 is a conventional circuit block that provides for the efficient transfer of the $RF_3$ and $RF_4$ signals from amplifier subsections 310A and 310B to corresponding amplifier subsections 320A and 320B in final amplifier stage 320.

In response to the $RF_5$ and $RF_6$ signals, output stage amplifier subsections 320A and 320B provide corresponding output signals $RF_7$ and $RF_8$. The output signal $RF_8$ is provided directly to intermediate output node 303. In contrast, the output signal $RF_7$ is routed to intermediate output node 303 through impedance inverter circuit 340. The RF signal provided by impedance inverter circuit 340 is labeled as signal $RF_9$. The delay introduced by impedance inverter circuit 340 must be equivalent to the delay introduced by delay circuit 330. These matched delays cause the $RF_8$ signal to be in phase with the $RF_9$ signal. To accomplish this, the delay introduced by delay circuit 330 is selected to be equal to the delay introduced by impedance inverter circuit 340. Because the $RF_8$ and $RF_9$ signals are in phase, these signals are combined (i.e., added) at intermediate output node 303, thereby resulting in an amplified RF output signal $RF_{OUT}$. The $RF_{OUT}$ signal is provided from output node 303 to output terminal 302 via output impedance match circuit 350. In one embodiment, the $RF_{OUT}$ signal drives an antenna (e.g., antenna 201) as a load. Thus, the impedance of output impedance match circuit 350 is designed to match the impedance associated with the antenna 201. Note that there is typically a duplexer or filter block between the power amplifier circuit 300 and the antenna 201.

Bias control circuit 315 provides amplifier bias signals $BIAS_1$ and $BIAS_2$ to amplifier subsections 310A and 310B via bias resistors 311 and 312, respectively. Similarly, bias control circuit 325 provides amplifier bias signals $BIAS_3$ and $BIAS_4$ to amplifier subsections 320A and 320B via bias resistors 321 and 322, respectively.

In one embodiment, the $BIAS_1$, $BIAS_2$, $BIAS_3$ and $BIAS_4$ signals are each generated in one of two discrete states. If the bias signals $BIAS_1$, $BIAS_2$, $BIAS_3$ and $BIAS_4$ are each activated to a first state, then the corresponding amplifier subsections 310A, 310B, 320A and 320B are enabled. If the bias signals $BIAS_1$, $BIAS_2$, $BIAS_3$ and $BIAS_4$ signals are each de-activated to a second state, then the corresponding amplifier subsections 310A, 310B, 320A and 320B are disabled.

In accordance with the described embodiment, power amplifier circuit 300 is capable of operating in a low power mode or a high power mode.

In the low power mode, bias control circuit 315 activates the $BIAS_1$ signal in the first state, and deactivates the $BIAS_2$ signal in the second state, thereby enabling low power amplifier subsection 310A and disabling high power amplifier subsection 310B. Also in the low power mode, bias control circuit 325 activates the $BIAS_3$ signal in the first state, and deactivates the $BIAS_4$ signal in the second state, thereby enabling low power amplifier subsection 320A and disabling high power amplifier subsection 320B.

In the high power mode, bias control circuit 315 activates both the $BIAS_1$ and $BIAS_2$ signals in the first state, thereby enabling both amplifier subsections 310A and 310B. Also in the high power mode, bias control circuit 325 activates both the $BIAS_3$ and $BIAS_4$ signals in the first state, thereby enabling both amplifier subsections 320A and 320B.

When activated, the $BIAS_1$, $BIAS_2$, $BIAS_3$ and $BIAS_4$ signals cause corresponding amplifier subsections 310A, 310B, 320A and 320B to operate as linear amplifiers (e.g., deep class AB, approaching class B, linear amplifiers). Amplifier stages 310 and 320 therefore operate differently from conventional Doherty amplifiers in which the peaking amplifier is biased to operate as a non-linear amplifier.

Bias control circuits 315 and 325 are controlled by an amplifier control signal HI/LO generated by control logic unit 305. The value of the HI/LO signal determines the states of bias signals $BIAS_1$, $BIAS_2$, $BIAS_3$ and $BIAS_4$. Control logic unit 305 provides a HI/LO signal having a first state when amplifier 300 is to be operated in the low power mode, and a HI/LO signal having a second state when power amplifier 300 is to be operated in the high power mode. These modes are identified in response to a control signal provided on input terminal 304. Control logic unit 305 (and power amplifier circuit 300) is enabled and disabled in response to a power amplifier enable control signal (PA ENABLE) provided on the input terminal 308. When the power amplifier circuit 300 is to be disabled, the power amplifier enable control signal is stepped.

Control logic unit 305 determines whether power amplifier circuit 300 is to be operated in the low power mode or the high power mode in a conventional manner (e.g., in response to a control signal on terminal 304, which identifies the low/high power mode). Many acceptable bias circuit and control logic unit topologies exist and design of these circuits will be routine in view of this disclosure. In one instance, control inputs to terminal 304 are typical 3.4 Volt CMOS voltage levels.

To summarize, during low power operation, amplifier subsections 310A and 320A are enabled to operate as linear amplifiers, and amplifier subsections 310B and 310B are disabled. In this case, the $RF_{IN}$ signal passes through input impedance match circuit 306, amplifier subsection 310A, inter-stage impedance match circuit 307, amplifier subsection 320A, impedance inverter element 340 and output impedance match circuit 350. Thus, delay circuit 330 and amplifier subsections 310B and 320B are effectively removed from the signal path. The $RF_9$ signal is passed as the output signal $RF_{OUT}$. This $RF_{OUT}$ signal corresponds with low power signal 212 of FIG. 2.

During high power operation, amplifier subsections 310A, 310B, 320A and 320B are all enabled to operate as linear amplifiers. In this case, the $RF_{IN}$ signal passes through the two parallel signal paths described above to provide the $RF_{OUT}$ signal at intermediate output terminal 303. In this case, the combined $RF_8$ and $RF_9$ signals are passed as the output signal $RF_{OUT}$. This $RF_{OUT}$ signal corresponds with high power signal 211 of FIG. 2.

During both high and low power operation, the amplifier subsections that are enabled are fully biased to operate as linear amplifiers. However, the quiescent current drawn by amplifier stages 310 and 320 during low power operation is advantageously reduced with respect to the quiescent current drawn by amplifier stages 310 and 320 during high power operation. The amount of quiescent current reduction is determined by the transistor structures present in the amplifier subsections 310A, 310B, 320A and 320B. The current density of the operating cells remains unchanged. For example, if amplifier subsections 310A and 320A each include M parallel-connected transistors, and amplifier subsections 310B and 320B each include N identical parallel-connected transistors, then the quiescent current is reduced from the full power level by a ratio of M/(N+M). Different transistor sizes can also be used in different amplifier subsections to adjust the quiescent current. For example, the transistors used in the amplifier subsections 310A and 320A can be one-fourth the size of the transistors used in amplifier subsections 310B and 320B.

As described in more detail below, the configuration of power amplifier circuit 300 advantageously allows for an optimized load impedance during high power operation, and for an improved load impedance during low power operation. The specific numeric values cited in the example below are intended to illustrate the operation of the present invention. Application specific required high and low power levels will set optimum values.

Figure 4A:
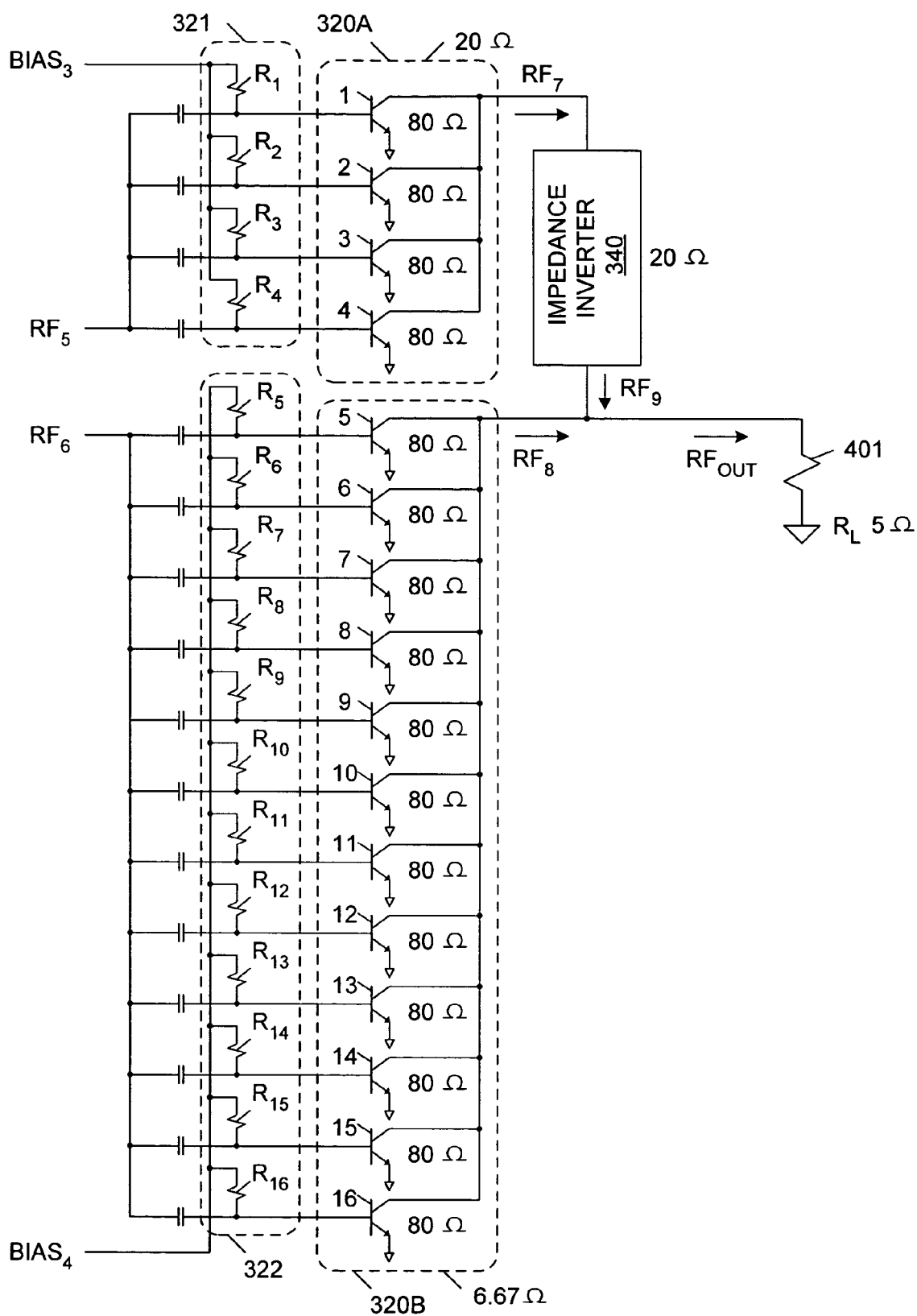
FIG. 4A is a circuit diagram of the amplifier subsections, bias resistors, impedance inverter element, and load impedance of the power amplifier circuit of FIG. 3, in accordance with one embodiment of the present invention.

FIG. 4A is a circuit diagram of amplifier subsections 320A and 320B, bias resistors 321 and 322, impedance inverter circuit 340, and load impedance 401 in accordance with one embodiment of the present invention. Load impedance 401 represents the transformed impedance of antenna 201 through output impedance match circuit 350. Load impedance 401 has a value of $R_L$ Ohms. Low power amplifier subsection 320A includes four parallel-connected NPN bipolar transistors 1-4. High power amplifier subsection 320B includes twelve parallel-connected NPN bipolar transistors 5-16. Bias resistor 321 includes four resistors $R_1$-$R_4$, which are coupled to provide the $BIAS_3$ signal to the bases of transistors 1-4, respectively. Bias resistor 322 includes twelve resistors $R_5$-$R_{16}$, which are coupled to provide the $BIAS_4$ signal to the bases of transistors 5-16, respectively.

In the described embodiment, the desired optimum load for each of transistors 1-16 is an impedance of 80 Ohms. Thus, when enabled, amplifier subsection 320A requires a load impedance of 20 Ohms (four 80 Ohm impedances in parallel). Similarly, when enabled, amplifier subsection 320B requires a load impedance of 6.66 Ohms (twelve 80 Ohm impedances in parallel). In the described embodiment, impedance inverter circuit 340 is selected to have a characteristic impedance $Z_0$ that matches the impedance of amplifier subsection 320A (i.e., 20 Ohms). An impedance inverter operates in accordance with the equation, $Z_0^2 = Z_{IN} \times Z_{OUT}$, wherein $Z_0$ is the characteristic impedance of the impedance inverter, $Z_{IN}$ is the impedance at the input of the impedance inverter, and $Z_{OUT}$ is the load impedance at the output of the impedance inverter. The load resistance 401 has a value of 5 Ohms in the described embodiment.

During high power operation, both amplifier subsections 320A and 320B are enabled. Under these circumstances, the desired 20-Ohm resistance of amplifier subsection 320A matches the characteristic impedance of impedance inverter circuit 340. Thus, when the load impedance seen at the output terminal of impedance inverter circuit 340 is 20 Ohms, no impedance transformation is seen, only a delay through impedance inverter 340. The 5-Ohm load impedance partitions into 20-Ohms seen at the output of delay element 340 in parallel with the 6.67-Ohm load resistance seen by amplifier subsection 320B (i.e., 20×6.67/(20+6.67)). This partitioning of the load impedance into partial loads for amplifier subsections 320A and 320B is dependent on the ratio of currents flowing into intermediate output node 303. Thus, the 5-Ohm load resistance 401 matches the 5-Ohm equivalent load resistance of amplifier subsections 320A and 320B. As is known to those skilled in the art, this results in efficient power transfer to the load resistance 401.

Stated in a general manner, for N total cells and M low power cells, amplifier subsection 320A drives a load of $N \times Z_{LOAD}/M$ and amplifier subsection 320B drives a load of $N \times Z_{LOAD}/(N-M)$.

During low power operation, amplifier subsection 320A is enabled and amplifier subsection 320B is disabled. Under these circumstances, the impedance associated with amplifier subsection 320B becomes very high (effectively infinite, or an open circuit). As a result, low power amplifier subsection 320A is loaded by the full output load impedance $R_L$, transformed through impedance inverter 340. More specifically, the load impedance seen by amplifier subsection 320A at the input terminal of impedance inverter 340 is equal to 80 Ohms (i.e., $20^2/5$ Ohms). Thus, 20-Ohm amplifier subsection 320A drives an effective load of 80 Ohms. Impedance inverter 340 therefore advantageously provides a load impedance increase (i.e., inverts the lower load impedance to a higher load impedance) at the output of amplifier subsection 320A when amplifier subsection 320B is biased (switched) off. The advantage of this is optimum loading for 1/N of the full power level of the power amplifier circuit 300. In this illustrative embodiment, N=16, so the low power operation is loaded for 1/16 of full power (or −12 dB below full power). In this way, the low power cells 320A operate at a much lower current level (more efficiently) in the low power mode. By incorporating impedance inverter 340 as illustrated in FIG. 3, overall efficiency may be optimized for both low and high power operation.

Note that in the absence of impedance inverter 340, low power amplifier subsection 320A would directly drive the 5-Ohm resistive load. With a load resistance of 5 Ohms for amplifier subsection 320A, the overall efficiency is poor. This is a consequence of the increase in load current due to the lower impedance load.

It is important to note that the impedance of delay element 330 is not in general the same as the impedance of delay element 340. The role of delay element 330 is to act as a delay line that matches the delay or phase shift of delay line 340.

Although the above described example uses one set of impedances, it is understood that other sets of impedances can be used in other embodiments. For example, for a CDMA application, each of transistors 1-16 would have an impedance of 64 Ohms, impedance inverter 340 would have an impedance of 12.8 Ohms, and load resistance 401 would have a resistance of 4 Ohms. In this embodiment, amplifier section 320A would include five transistors, and amplifier section 320B would include 11 transistors.

In the above-described embodiment, bias control circuits 315 and 325 provide the $BIAS_2$ and $BIAS_4$ signals as one of two stepped (discrete logic) voltage levels. In another embodiment, bias control circuits 315 and 325 provide the $BIAS_2$ and $BIAS_4$ signals as analog control signals. Using analog control signals allows impedance inverter 340 to provide a continuous dynamic load benefit, rather than two discrete states. In one instance, in which the $BIAS_2$ and $BIAS_4$ signals are analog, these signals act to control the operation of high power amplifier subsections 320B and 320B, respectively, from a nearly-off state to a linear amplifier state.

Although the present example uses sixteen bipolar transistors 1-16, it is understood that other numbers of transistors can be used in other embodiments. Moreover, while the present example uses four transistors in the low power amplifier subsection 320A and twelve transistors in the high power amplifier subsection 320B, it is understood that other numbers of transistors can be used in the various amplifier subsections.

Figure 4B:
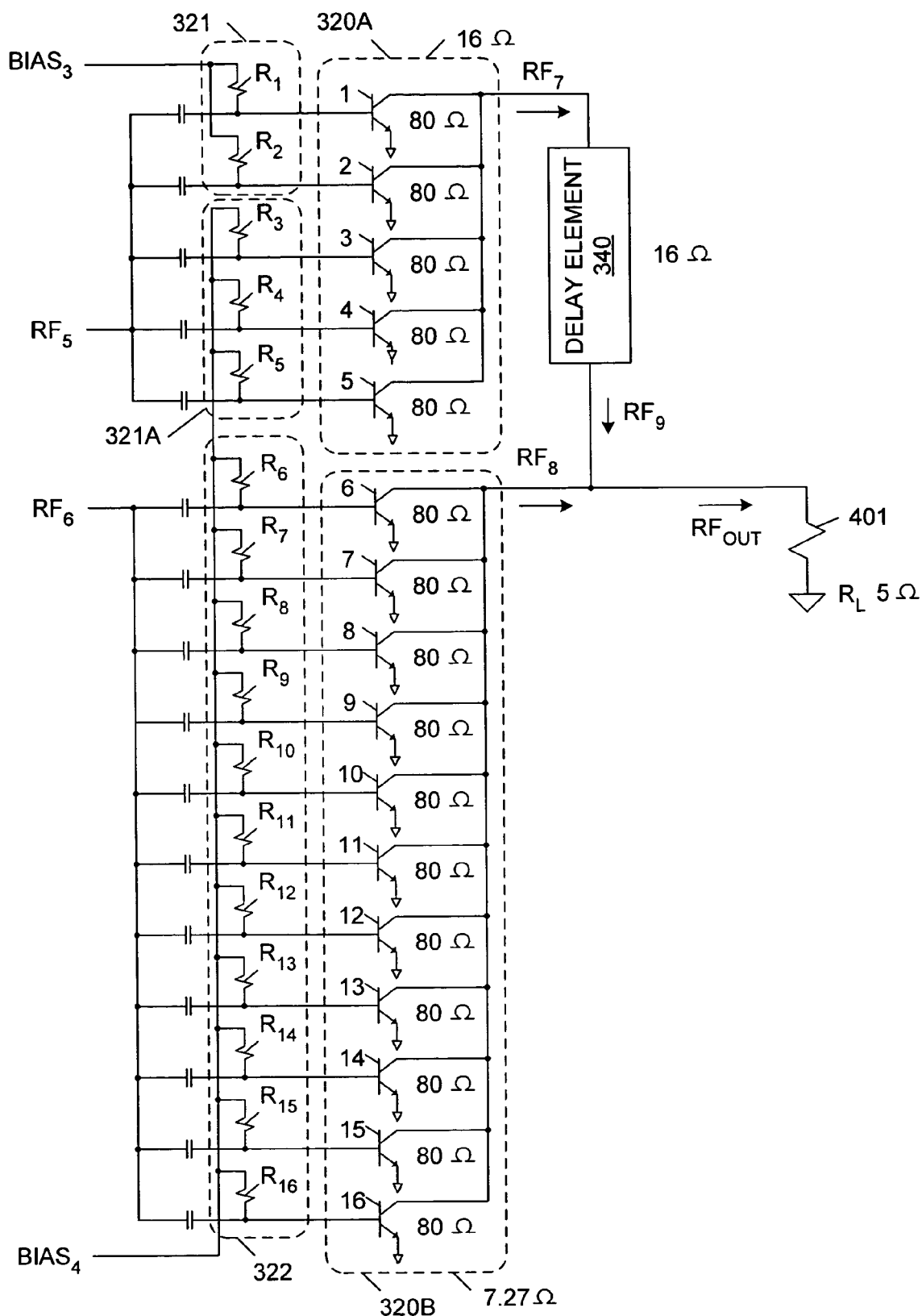
FIG. 4B is a circuit diagram of the amplifier subsections, bias resistors, impedance inverter element, and load impedance of the power amplifier circuit of FIG. 3, in accordance with another embodiment of the present invention.

FIG. 4B is a circuit diagram of amplifier subsections 320A and 320B, bias resistors 321 and 322, delay element 340, and load impedance 401 in accordance with another embodiment of the present invention. This embodiment includes the same elements illustrated in FIG. 4A, but with a slightly different configuration. In the embodiment of FIG. 4B, low power amplifier subsection 320A includes transistors 1-5 and high power amplifier subsection 320B includes transistors 6-16. Resistors $R_1$ and $R_2$ form bias resistor 321, and are configured to receive the $BIAS_3$ signal. Resistors $R_6$-$R_{16}$ form bias resistor 322, and are configured to receive the $BIAS_4$ signal. However, resistors $R_3$-$R_5$ form a switched resistor 321A, which is configured to receive the $BIAS_4$ signal.

In the described embodiment, each of transistors 1-16 optimally requires a load impedance of 80 Ohms. Thus, when enabled, amplifier subsection 320A views a load impedance of 16 Ohms (five 80 Ohm impedances in parallel). Similarly, when enabled, amplifier subsection 320B views a load impedance of 7.27 Ohms (eleven 80 Ohm impedances in parallel). In the described embodiment, impedance inverter circuit 340 is selected to have a characteristic impedance $Z_0$ that matches the optimum load impedance of amplifier subsection 320A (i.e., 16 Ohms). The load resistance 401 has a value of 5 Ohms in the described embodiment.

During high power operation, both amplifier subsections 320A and 320B are enabled. Under these circumstances, the 5-Ohm load is partitioned into a 16-Ohm load resistance applied to impedance inverter circuit 340 and a 7.27-Ohm load viewed by amplifier subsection 320B. The impedance seen by amplifier subsection 320A through impedance inverter 340 is 16-Ohms, since the characteristic impedance of impedance inverter 340 matches the optimum load impedance of amplifier subsection 320A (i.e., $16^2/16$ Ohms). Thus, no impedance transformation is seen, only a delay through impedance inverter 340. The 5-Ohm equivalent resistance of amplifier subsections 320A and 320B matches the 5-Ohm load resistance 401. As is known to those skilled in the art, this results in efficient power transfer to the load resistance 401.

During low power operation, transistors 1 and 2 of low power amplifier subsection 320A are enabled, transistors 3-5 of low power amplifier subsection 320A are disabled, and high power amplifier subsection 320B is disabled. Under these circumstances, the impedances associated with amplifier subsection 320B and transistors 3-5 become very high (effectively infinite, or an open circuit). As a result, transistors 1 and 2 of low power amplifier subsection 320A are loaded by the full output load impedance $R_L$, transformed through impedance inverter 340. More specifically, the load impedance seen by amplifier subsection 320A at the input terminal of impedance inverter 340 is equal to 51.2 Ohms (i.e., $16^2/5$ Ohms). Transistors 1 and 2 optimally require an equivalent impedance of 40 Ohms (i.e., 80/2 Ohms). Amplifier subsection 320A drives an effective load of 51.2 Ohms. This is acceptably close to the 40-Ohm target load impedance. Impedance inverter 340 therefore advantageously provides a load impedance increase (i.e., inverts the lower load impedance to a higher load impedance) at the output of amplifier subsection 320A when amplifier subsection 320B is biased (switched) off. By enabling only transistors 1 and 2 during low power operation, the impedance of amplifier subsection advantageously approximates the desired load impedance. In this manner, overall efficiency is optimized for both low and high power operation.

Figure 5:
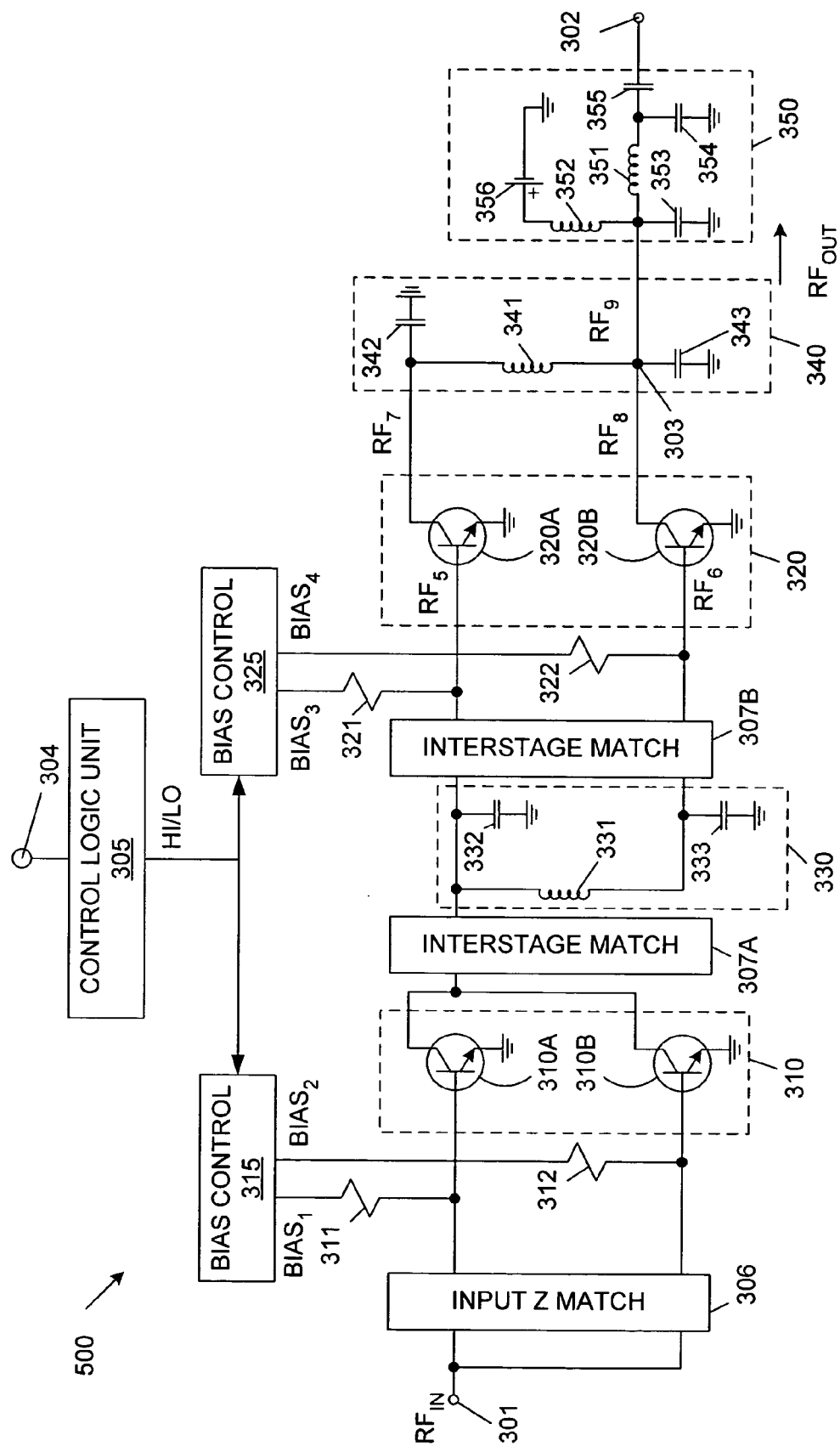
FIG. 5 is a block diagram of a linear power amplifier circuit having a low power mode and a high power mode, in accordance with another embodiment of the present invention.

FIG. 5 is a circuit diagram illustrating power amplifier circuit 500 in accordance with one embodiment of the present invention. Similar elements in FIGS. 3 and 5 are labeled with similar reference numbers. Thus, power amplifier circuit 500 includes input terminal 301, output terminal 302, intermediate output terminal 303, control logic unit 305, input impedance match circuit 306, input stage amplifier 310, bias resistors 311-312, input stage bias control circuit 315, output stage amplifier 320, bias resistors 321-322, output stage bias control circuit 325, delay element 330, delay element 340 and output impedance match circuit 350. Inter-stage impedance match circuit 307 is replaced with partial inter-stage impedance match circuits 307A and 307B. Delay element 330 is moved to a location between partial inter-stage impedance match circuits 307A and 307B.

The $RF_{IN}$ signal is provided to input impedance match circuit 306 as a pair of parallel signals. In response, input impedance match circuit 306 provides a pair of matched RF signals to amplifier stage 310. The output RF signals provided by amplifier stage 310 are combined (e.g., collectors of the BJTs are coupled together as depicted) to form a single RF signal, which is provided to partial inter-stage impedance match circuit 307A. Partial inter-stage impedance match circuit 307A passes this RF signal to delay element 330, which in turn provides a delayed RF signal and a non-delayed RF signal to partial inter-stage impedance match circuit 307B. Partial inter-stage impedance match circuit 307B provides RF signals, which are equivalent to RF signals $RF_5$ and $RF_6$ (FIG. 3) to amplifier stage 320. The remainder of power amplifier circuit 500 operates in the same manner as power amplifier circuit 300 (described above). The partitioning of the inter-stage matching network 307 into 307A and 307B typically occurs at an internal reference plane where the impedance at the input to partial inter-stage matching network 2307B is mostly real.

The circuit topology of power amplifier circuit 500 allows the inductor 331 of delay element 330 to be smaller than the corresponding inductor in power amplifier circuit 300. The circuit configuration of power amplifier circuit 500 is illustrative. In embodiments where power amplifier circuit 500 has three or more stages, delay element 330 can be coupled at any inter-stage location in accordance with the teachings of FIG. 5.

Power amplifier circuit 500 can produce four possible output power levels because the amplified signal is combined at the output of amplifier stage 310, and then split again by delay element 330. To operate at the lowest power level, amplifier subsections 310A and 320A are enabled and amplifier subsections 310B and 320B are disabled. To operate at a first intermediate power level, amplifier subsections 310A, 310B and 320A are enabled and amplifier subsection 320B is disabled. To operate at a second intermediate power level, amplifier subsections 310A, 320A and 320B are enabled and amplifier subsection 310B is disabled. To operate at the highest power level, amplifier subsections 310A, 310B, 320A and 320B are all enabled.

Thus, in power amplifier circuit 500, amplifier stage 310 is operated to produce either a low or high output power level either by operating amplifier subsection 310A alone (low output power), or by operating both amplifier subsections 310A and 310B (high output power). Each amplifier subsection 310A and 310B operates as a linear amplifier if biased on, since overall linear amplification is desired.

Similarly, amplifier stage 320 is operated to produce either a low or high output power level either by operating amplifier subsection 320A alone (low output power), or by operating both amplifier subsections 320A and 320B together (high output power). Each amplifier subsection 320A and 320B operates as a linear amplifier if biased on. There may be instances, however, when overall linear amplification is not desired, and in such instances the amplifier subsections may be operated as other than linear amplifiers.

Figure 6:
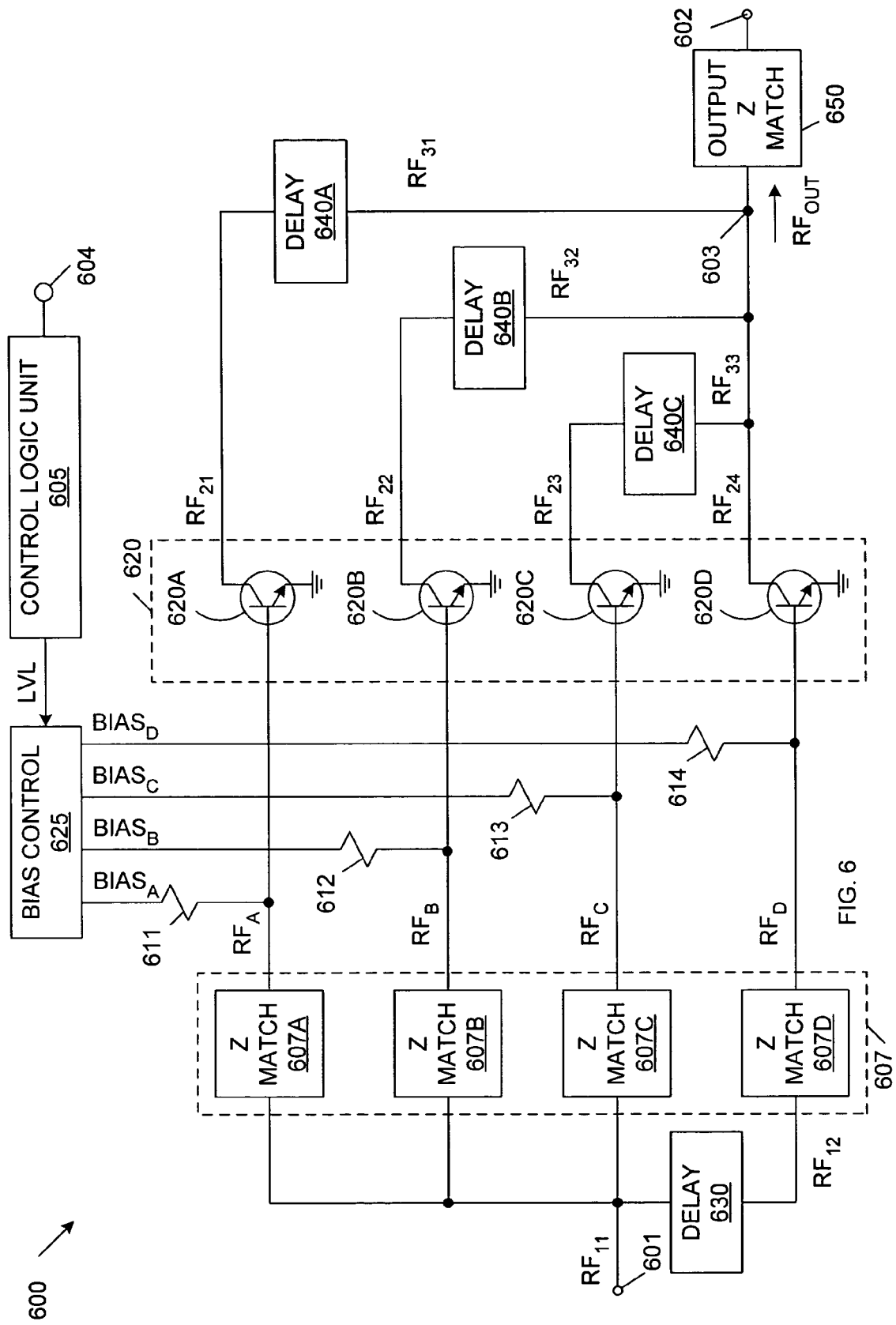
FIG. 6 is a circuit diagram of a linear power amplifier output stage having multiple low power modes and a high power mode in accordance with another embodiment of the present invention.

FIG. 6 is a circuit diagram of a final stage amplifier circuit 600 in accordance with yet another embodiment of the present invention. Final stage amplifier circuit 600 includes input terminal 601, output terminal 602 intermediate output terminal 603, control input terminal 604, control logic unit 605, input impedance match circuit 607, bias resistors 611-614, final amplifier stage 620, bias control circuit 625, delay element 630 and delay elements 640A, 640B and 640C. Impedance match circuit 607 includes impedance match elements 607A, 607B, 607C and 607D. In single amplifier stage embodiments, impedance match unit 607 functions as an input match unit. In multiple amplifier stage embodiments, impedance match unit 607 functions as an inter-stage match unit. Final amplifier stage 600 includes low power amplifier subsections 620A, 620B and 620C, and high power amplifier subsection 620D. If biased (switched) on, amplifier subsections 620A-620D operate as linear amplifiers. As discussed above, amplifier subsections 620A-620D may each be one or more transistors of various types, including one or more coupled cells in multi-cell GaAs HBTs.

An RF input signal $RF_{11}$ is provided directly to impedance match elements 607A, 607B and 607C. A delayed version of the $RF_{11}$ signal (i.e., $RF_{12}$) is provided to impedance match element 607D via delay element 630. In the described embodiment, delay element 630 is identical to delay circuit 330 (FIG. 3). Impedance match elements 607A, 607B, 607C and 607D provide the signals $RF_A$, $RF_B$, $RF_C$ and $RF_D$, respectively, to amplifier subsections 620A, 620B, 620C and 620D, respectively. Bias control circuit 625 provides the bias control signals $BIAS_1$, $BIAS_2$, $BIAS_3$ and, $BIAS_4$ to amplifier subsections 620A, 620B, 620C and 620D, respectively. Bias control circuit 625 operates in response to a multi-bit level control signal LVL provided by control logic unit 605. Control logic unit 605, in turn, provides the LVL signal in response to a multi-bit control signal provided on control input terminal 604.

When enabled, amplifier subsections 620A, 620B, 620C and 620D provide amplified output signals $RF_{21}$, $RF_{22}$, $RF_{23}$ and $RF_{24}$, respectively. The output signals $RF_{21}$, $RF_{22}$ and $RF_{23}$ are provided to delay elements 640A, 640B and 640C, respectively, thereby providing output signals $RF_{31}$, $RF_{32}$ and $RF_{33}$, respectively. In the described embodiment, each of delay elements 640A, 640B and 640C is identical to impedance inverter circuit 340 (FIG. 3). The output signals $RF_{24}$, $RF_{31}$, $RF_{32}$ and $RF_{33}$ are combined to create output signal $RF_{OUT}$, which is routed through output impedance match circuit 650. In the described embodiment, output impedance match circuit 650 is identical to output impedance match circuit 350 (FIG. 3).

The delay introduced by delay element 630 is selected to match the delay introduced by each of delay elements 640A-640C, such that the signals $RF_{24}$, $RF_{31}$, $RF_{32}$ and $RF_{33}$ are all in phase.

In response to the LVL signal, bias control circuit 625 biases (switches on) various combinations of amplifier subsections 620A, 620B and 620C to generate various low power output signal levels. Also in response to the LVL signal, bias control circuit 625 biases (switches on) amplifier subsection 620D to operate in combination with one or more subsections 620A, 620B and/or 620C. Thus bias signals $BIAS_1$-$BIAS_4$ cause the associated amplifier subsections 620A-620D to operate in either an off state or a linear amplifier state. Bias signals $BIAS_1$-$BIAS_4$ may either be digital or analog, as described above. As described above, amplifier subsection 620D may have larger or more coupled transistors or transistor cells than each of amplifier subsections 620A, 620B and 620C. Amplifier subsections 620A, 620B and 620C may have the same number of transistors, or different numbers of transistors.

Although the invention has been described in connection with several embodiments, it is understood that this invention is not limited to the embodiments disclosed, but is capable of various modifications, which would be apparent to one of ordinary skill in the art. Thus, the invention is limited only by the following claims.

We claim:

1. A power amplifier circuit comprising:
   a first amplifier having a first subsection and a second subsection, the first amplifier configured to receive an input signal, and in response, provide a first path output signal;
   a first delay circuit configured to introduce a first delay to the input signal, thereby creating a second path delayed input signal;

a second amplifier having a first subsection and a second subsection, the second amplifier configured to receive the second path delayed input signal, and in response, provide a second path delayed output signal, wherein the first subsection is enabled;

an impedance inverter circuit configured to provide impedance inversion and introduce a first path delay to the first path output signal, thereby creating a first path delayed output signal;

a node connecting an output of the impedance inverter and an output of the second amplifier, the node configured to combine the first path and second path delayed output signals, thereby creating an amplified output signal; and a bias control circuit configured to provide a first bias voltage that enables the first subsection of the first amplifier and the first subsection of the second amplifier, to causes the enabled subsections to operate in a linear mode during a low power mode, wherein the second subsection of the first amplifier and the second subsection of the second amplifier are disabled in the low power mode, and a second bias voltage that enables the second subsection of the first amplifier and the second subsection of the second amplifier, wherein the first subsection of the first amplifier and the first subsection of the second amplifier are enabled in the high power mode, to causes the enabled amplifier subsections to operate in a linear mode during a high power mode.

2. The power amplifier of claim 1, wherein the bias control circuit comprises:

means for activating the first bias voltage and deactivating the second bias voltage when a control signal identifies the low power mode; and means for activating both the first and second bias voltages when the control signal identifies the high power mode.

3. The power amplifier of claim 1, further comprising an impedance matching circuit, wherein the input signal is provided to the first amplifier and the delayed input signal is provided to the second amplifier through the impedance matching circuit.

4. The power amplifier of claim 3, further comprising an input amplifier stage, wherein the input signal is provided to the first amplifier and the delayed input signal is provided to the second amplifier through the input amplifier stage.

5. The power amplifier of claim 1, wherein the first delay circuit comprises an impedance inverter circuit.

6. The power amplifier of claim 5, wherein the first amplifier exhibits a first impedance optimum load, and the second amplifier exhibits a second impedance optimum load, and the impedance inverter circuit exhibits a characteristic impedance equal to the first impedance.

7. The power amplifier of claim 1, wherein the first delay is equal to the second delay.

8. The power amplifier of claim 1, wherein the first amplifier comprises a first set of transistors, and the second amplifier comprises a second set of transistors.

9. The power amplifier of claim 8, wherein the first set of transistors are coupled to receive the first bias voltage, and the second set of transistors are coupled to receive the second bias voltage.

10. The power amplifier of claim 8, wherein a first subset of the first set of transistors are coupled to receive the first bias voltage, a second subset of the first set of transistors are coupled to receive the second bias voltage, and the second set of transistors are coupled to receive the second bias voltage.

11. The power amplifier of claim 1, further comprising:

a third amplifier configured to receive an input signal, and in response, provide a second output signal; and a third delay circuit configured to introduce the second delay to the second output signal, thereby creating a third delayed output signal;

wherein the means for combining combines the first, second and third delayed output signals, thereby creating the amplified output signal, and the bias control circuit is configured to provide a third bias voltage that causes the third amplifier operate in a linear mode when the third amplifier is enabled.

12. A power amplifier circuit comprising:

a first amplifier having a first subsection and a second subsection, the first amplifier configured to receive an input signal, and in response, provide a first path output signal;

a first delay circuit configured to introduce a first delay to the input signal, thereby creating a second path delayed input signal;

a second amplifier having a first subsection and a second subsection, the second amplifier configured to receive the second path delayed input signal, and in response, provide a second path delayed output signal, wherein the first subsection is enabled;

an impedance inverter circuit configured to provide impedance inversion and introduce a first path delay to the first path output signal, thereby creating a first path delayed output signal;

a node connecting an output of the impedance inverter and an output of the second amplifier, the node configured to combine the first path and second path delayed output signals, thereby creating an amplified output signal; and a bias control circuit configured to enable the first subsection of the first amplifier stage, the second subsection of the first amplifier stage, and the first subsection of the second amplifier stage, to cause the enabled subsections operate in a linear mode during a low power operation, wherein the second subsection of the second amplifier stage is disabled in the low power operation, and a second bias voltage that enables the second subsection of the second amplifier stage during a high power operation, wherein all subsections are enabled in the high power operation, to cause the enabled amplifier stages to operate in a linear mode during the high power operation.

* * * * *